(12) United States Patent
Munson et al.

(10) Patent No.: US 10,667,405 B2
(45) Date of Patent: May 26, 2020

(54) METHOD FOR DEPOSTING A FUNCTIONAL MATERIAL ON A SUBSTRATE

(71) Applicant: NCC NANO, LLC, Dallas, TX (US)

(72) Inventors: Charles C. Munson, Dallas, TX (US); Kurt A Schroder, Coupland, TX (US); Rob Jacob Hendriks, Eindhoven (NL)

(73) Assignee: NCC NANO, LLC, Dallas, TX (US)

( * ) Notice: Subject to any disclaimer, the term of this patent is extended or adjusted under 35 U.S.C. 154(b) by 0 days.

(21) Appl. No.: 15/620,554

(22) Filed: Jun. 12, 2017

(65) Prior Publication Data

US 2017/0275750 A1    Sep. 28, 2017

Related U.S. Application Data

(63) Continuation of application No. 15/387,297, filed on Dec. 21, 2016, and a continuation of application No. 15/072,180, filed on Mar. 16, 2016.

(51) Int. Cl.
*H05K 3/04* (2006.01)
*H05K 3/20* (2006.01)

(52) U.S. Cl.
CPC ............. *H05K 3/046* (2013.01); *H05K 3/207* (2013.01); *H05K 2203/107* (2013.01)

(58) Field of Classification Search
CPC .......................... H05K 3/046; H01L 51/0013
See application file for complete search history.

(56) References Cited

U.S. PATENT DOCUMENTS

| 6,114,088 A * | 9/2000 | Wolk ..................... B41M 3/006 346/135.1 |
| 6,271,631 B1* | 8/2001 | Burrows ................. G09F 13/22 313/511 |
| 2003/0178395 A1* | 9/2003 | Duignan ............ B23K 15/0006 219/121.68 |
| 2005/0052128 A1* | 3/2005 | Nakanishi .............. H01H 13/83 313/506 |
| 2012/0251772 A1* | 10/2012 | Aoyama ............. H01L 51/0013 428/138 |
| 2015/0333259 A1* | 11/2015 | Cho .................... H01L 51/0013 428/172 |

FOREIGN PATENT DOCUMENTS

EP            2660352 A1 * 11/2013   ............. C23C 14/28

* cited by examiner

*Primary Examiner* — Joel G Horning
(74) *Attorney, Agent, or Firm* — Russell Ng PLLC; Anthony P. Ng

(57) ABSTRACT

A method for depositing a functional material on a substrate is disclosed. A plate having a first surface and a second surface is provided. A layer of light scattering material is applied onto the first surface of the plate, and a layer of reflective material is applied onto the second surface of the plate. After a group of wells has been formed on the second surface of the plate, a layer of light-absorbing material is applied on the second surface of the plate. Next, the wells are partially filled with a functional material. The plate is then irradiated with a pulse of light to heat the light-absorbing material between the bottom of the well and the functional material. This heats the gas in the ullage between the light absorbing material and the functional material to increase the pressure in gas to expel the functional material from the wells onto a receiving substrate.

22 Claims, 6 Drawing Sheets

METHOD FOR DEPOSTING A FUNCTIONAL MATERIAL ON A SUBSTRATE

RELATED PATENT APPLICATION

The present patent application is a continuation-in-part of copending applications U.S. Ser. No. 15/072,180 and U.S. Ser. No. 15/387,297, filed on Mar. 16, 2016 and on Dec. 21, 2016, respectively, the pertinent of which are incorporated by reference herein.

TECHNICAL FIELD

The present invention relates to printing processes in general, and, in particular, to a method for depositing a functional material on a substrate.

BACKGROUND

Printing is a common method for selectively depositing a functional material on a substrate. The functional material needs to be formulated with other materials before the functional material can be printed on a substrate. Since a formulation is typically formed by dispersing the functional material in a solvent or liquid, the formulation is is generally wet. Thus, the formulation is often referred to as an ink or paste, depending on the viscosity.

Whether it is an ink or a paste, a formulation typically includes certain additives intended to make the printing process easier and more reliable, but those additives may also interfere with the properties of the functional material. For example, when depositing biological materials, the presence of additives and even artifacts of the deposition process, such as high temperature, can render the biological material inactive. Thus, if the additives within the formulation do not substantially interfere with the intended functions of the functional material to be deposited, the additives can stay in the functional material; otherwise, the additives must be removed from the functional material.

The present disclosure provides an improved method for depositing a functional material on a substrate.

SUMMARY OF THE INVENTION

In accordance with a preferred embodiment of the present invention, a plate having a first surface and a second surface is provided. After a group of wells has been formed on the second surface of the plate, a layer of light-absorbing material is applied on the surface of the wells. Next, the wells are partially filled with a functional material leaving a gap between the bottom of the wells and the functional material. The plate is then irradiated with a pulse of light to heat the light-absorbing material that heats the gas in the gap between the bottom of the wells and the functional material, thereby increasing the pressure of the gas in the gap between the bottom of the wells and the functional material to propel the functional material from the wells onto a receiving substrate.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Ideally, instead of printing a functional material on a substrate, selectively depositing a pure functional material on a substrate is most preferable, but it is almost never done. To a certain extent, printing a near pure functional material, such as pastes with high solids content, can be performed by using a Laser Induced Forward Transfer (LIFT) process.

Figure 1A:
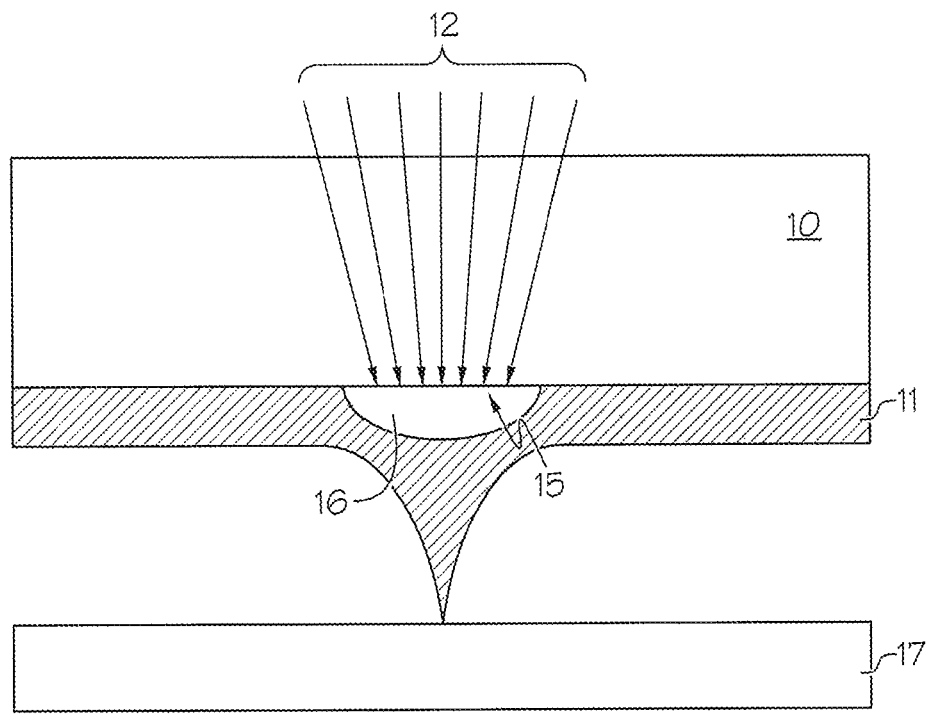
FIGS. 1A-1B depict a laser induced forward transfer process.
Figure 1B:
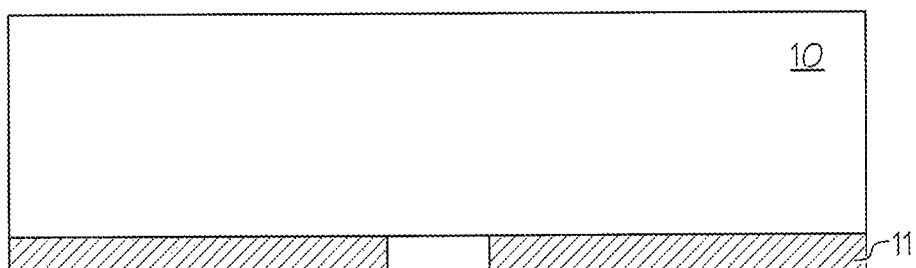
Figure 1B:
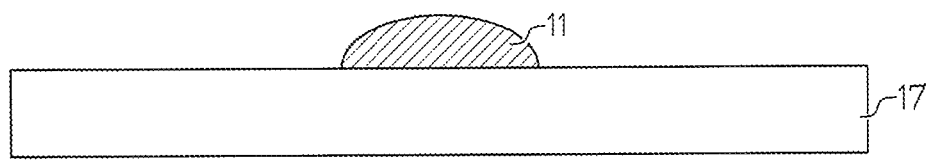

Referring now to the drawings and in particular to FIGS. 1A-1B, there is depicted the LIFT process. Initially, a functional material 11 is placed on one side of a donor substrate 10 that is at least partially optically transparent. A laser beam 12 is then placed on the other side (opposite from the side on which functional material 11 is placed) of donor substrate 10, and laser beam 12 is focused to a point near an interface 15 between functional material 11 and donor substrate 10, as shown in FIG. 1A. A gas 16 is subsequently generated at interface 15, and gas 16 propels a small portion of functional material 11 onto a receiver substrate 17, as shown in FIG. 1B.

There are several disadvantages with the LIFT process. First, the thicker the deposition, the lower the resolution of a final print. Second, since only a single spot of functional material can be transferred at a time, the LIFT process can only be performed in a serial manner. Third, there is a considerable amount of waste in the LIFT process because only a relatively small portion of the functional material on the donor substrate is utilized. Finally, and perhaps the biggest disadvantages of the LIFT process is that there are specific requirements on the dynamic characteristics of the functional material to be printed. In other words, the LIFT process is not suitable for all types of functional materials, and the printing parameters need to be fine-tuned for each type of functional materials. The margin of error for the tuning is relatively small because the homogeneity of the layer thickness and the viscosity will vary across the entire donor substrate.

Another disadvantage of the LIFT process is that when trying to pattern thermally fragile materials, such as biological materials (proteins, cells, etc.) they may be damaged by direct exposure to the energetic laser beam. One technique that has been used with some success is the introduction of a Dynamic Release Layer (DRL). This sacrificial layer is deposited on the donor substrate before the functional material is deposited. Its purpose is to absorb the laser beam and volatilize to eject the functional material without the high energy laser beam directly contacting the thermally fragile functional material. A disadvantage of using a DRL is that it is either partially volatilized or completely volatilized. For the former, the DRL can end up in the deposition of the functional material. For the latter, there is a risk that some of the functional material is damaged by the beam. Additionally, with this approach, the amount of material that is deposited is sensitive to the fluence of the laser. Thus, even with the DRL, it is difficult to both precisely dispense and deposit a pure functional material without damaging it.

Figure 2:
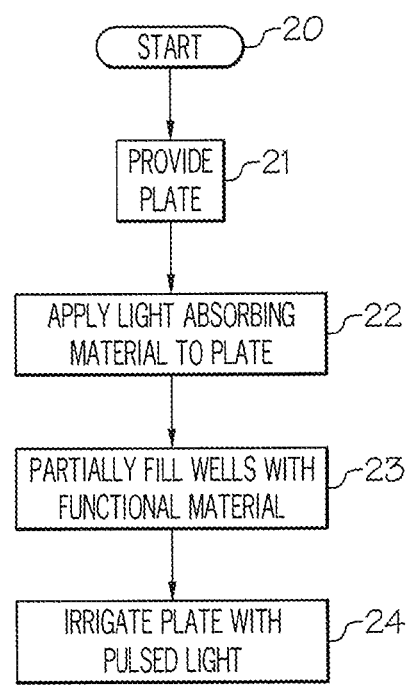
FIG. 2 is a process flow diagram of a method for depositing a functional material on a substrate; sand FIGS. 3A-3D graphically illustrates the method of FIG. 2.
Figure 3A:
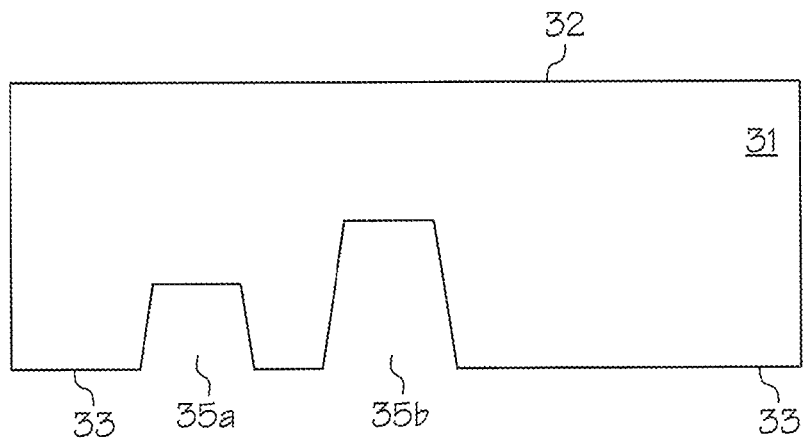

With reference now to FIG. 2, there is illustrated a method for depositing a functional material on a substrate, in accordance with an embodiment of the present invention. Starting at block 20, an optically transparent plate is provided, as shown in block 21. The optically transparent plate is preferably made of quartz. The optically transparent plate, which is depicted as a plate 31 in FIG. 3A, includes a first surface 32 and a second surface 33. First surface 32 is preferably flat, but it can also be curved. Second surface 33 preferably includes multiple wells 35a and 35b. The depth of each of wells 35a-35b can be different from each other. For example, the depth of each of wells 35a-35b is preferably between 10 nm to 1,000 µm, and the exact depth of a well depends on specific application. Wells 35a-35b are preferably formed by laser femptosecond laser drilling, but they can also be formed by chemical or plasma etching. Although only two wells 35a-35b are shown in FIG. 3A, it is understood by those skilled in the art that second surface 33 may have more than two wells.

Figure 3B:
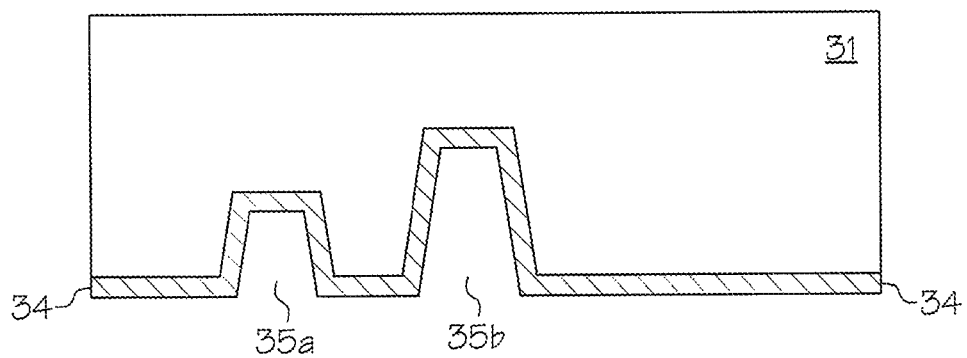

A layer of light-absorbing material 34 is then applied to wells 35a-35b, as depicted in block 22 and in FIG. 3B.

Figure 3C:
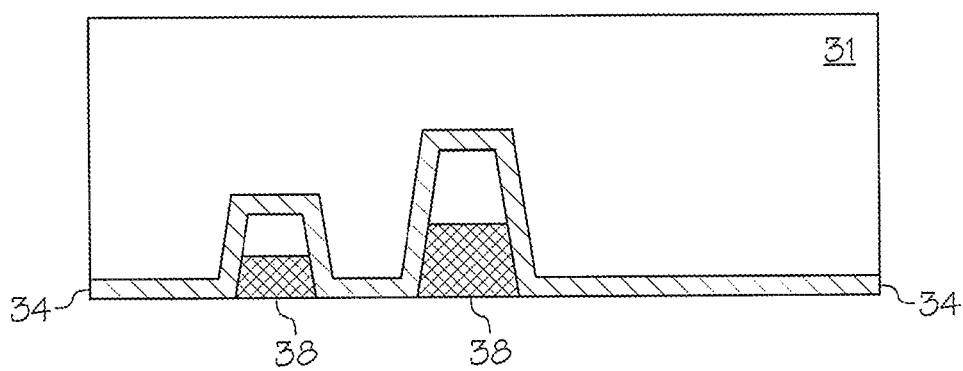

Next, wells 35a-35b are partially filled with a functional material 38, as shown in block 23 and in FIG. 3C. Functional material 38 can be in the form of an ink or paste. For example, a squeegee or doctor blade can be utilized to fill wells 35a-35b with functional material 38.

Figure 3D:
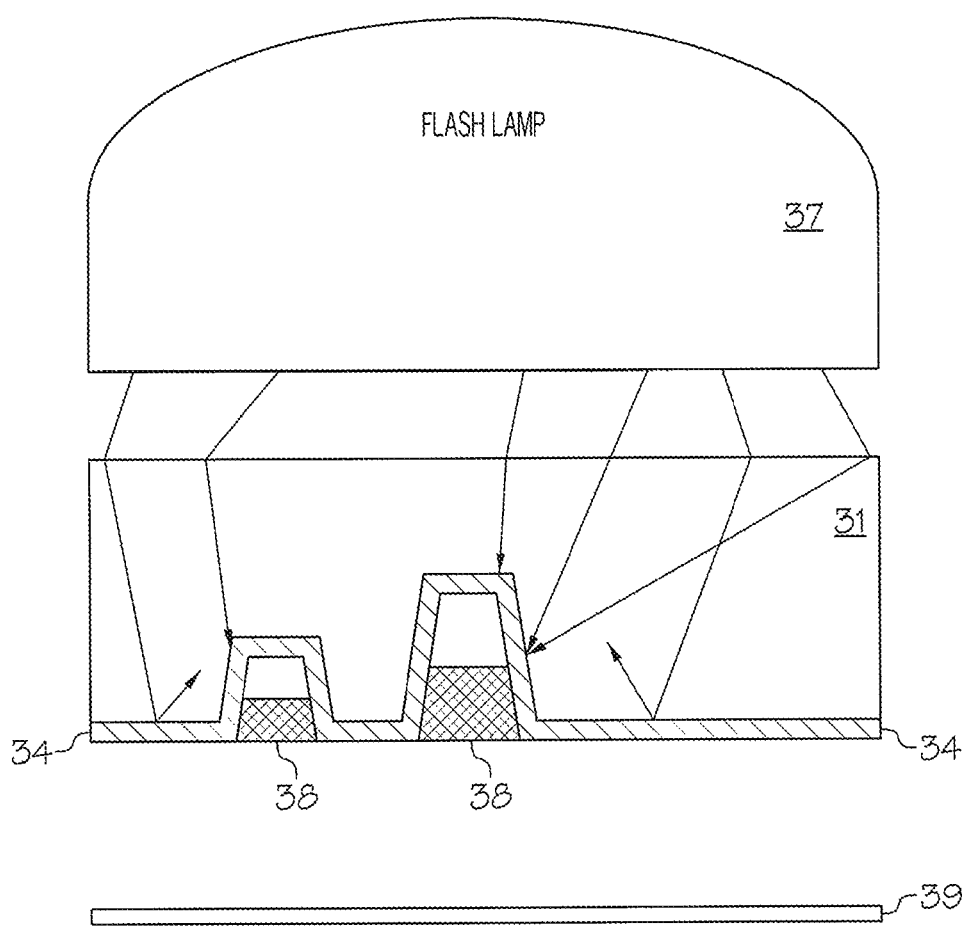

After wells 35a-35b have been filled with functional material 38, plate 31 is irradiated by a pulsed light, preferably on first surface 32, as depicted in block 24 and in FIG. 3D. Preferably, the pulsed light is generated by a flashlamp 37, but a pulsed laser may also be used.

When the pulsed light hits plate 31, a portion of the light is absorbed by light-absorbing material layer 34. When light-absorbing material layer 34 is being heated, the gas in the ullage of wells 35a-35b is also being heated. This increases the pressure of the gas in the ullage region. When the gas pressure is high enough to overcome the force holding functional material 38 within wells 35a-35b, the gas then expels functional material 38 from plate 31 to a receiving substrate 39. The transfer of functional material 38 may also be assisted by gravity.

Functional material 38 may include a variety of materials including adhesives, thermoplastics, thermosets, epoxies, electrically conductive materials, thermally conductive materials, etc. Functional material 38 may also include biological materials such as growth factors (i.e., BDNF, GDNF, NGF, VEGF), immune proteins and enzymes (i.e., Fab fragment of IgG, immunoglobulins, lysozyme), oligonucleotides, whole viruses, and pharmaceuticals such as actinomycin, aldose Reductase Inhibitor, copper nanoparticles, digoxin, doxorubicin, estradiol, floxuridine (FUDR), barium sulfate, iodine beads, methotrexate, nicotine, paclitaxel, prednisone, rapamycin, tetracycline, triclosin, vinblastine etc.

Alternative Embodiments

Figure 4:
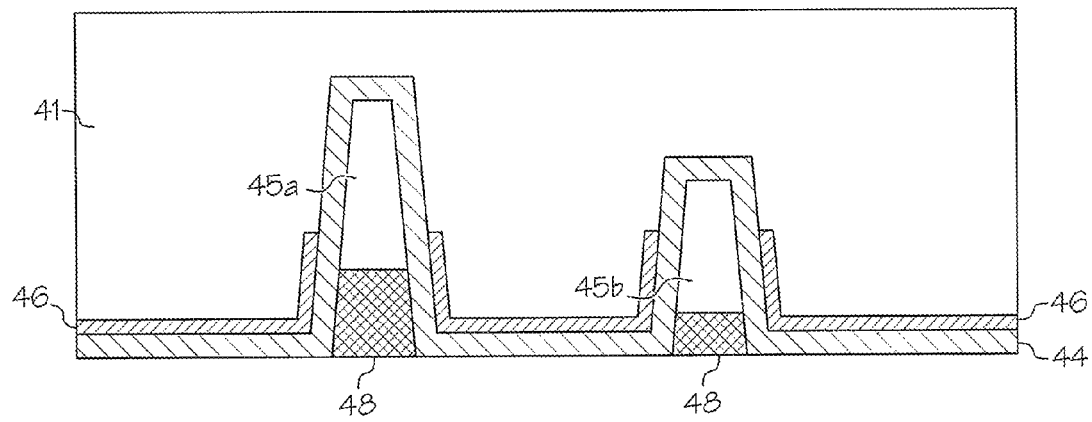
FIG. 4 depicts a second embodiment of the present invention.

It is desirable to dispense functional material 38 with minimal heating to functional material 38. One way that can avoid the direct heating of functional material from direct contact with the sides of wells is to drill a set of pre-wells followed by depositing a reflective layer 46 on one surface of plate 41, covering the inside of the pre-wells. Then, additional trenchings are made to the pre-wells to form wells 45a-45b. Next, a light-absorbing layer 44 is deposited the one surface of plate 41, covering the inside of wells 45a-45b (similarly to block 22 in FIG. 2). This two-step well drilling allows reflective layer 46 to be located near the opening of wells 45a-45b but not at the bottom of wells 45a-45b. Functional material 48 is subsequently added to partially fill wells 45a-45b (similarly to block 23 in FIG. 2). Light-absorbing layer 44 can be Tungsten, and reflective layer 46 can be aluminum. The final configuration is shown in FIG. 4.

Figure 5:
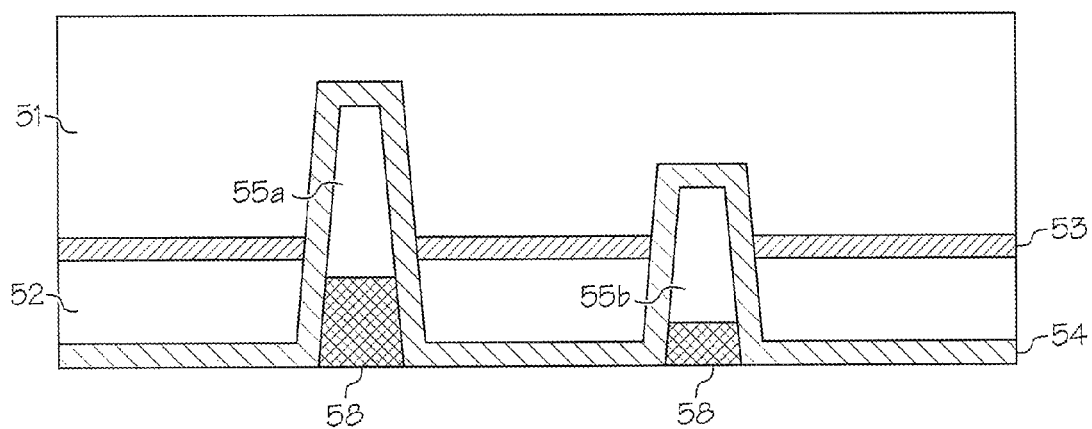
FIG. 5 depicts a third embodiment of the present invention.

Another way to avoid directly heating of functional material is to provide a first plate 51, as shown in FIG. 5, and deposit a reflective layer 53 on one surface of first plate 51, followed by adding a second plate 52 to reflective layer 53. Second plate 42 can be formed by adhering a preformed plate to reflective layer 53 or by depositing a thick coating to reflective layer 53. Next, wells 55a-55b are formed by drilling completely through second plate 52 and through reflective layer 53 into first plate 51. Finally, one surface of second plate 52 is coated with an light-absorbing layer 54. A functional material 58 can then be added to partially fill wells 55a-55b (similarly to block 23 in FIG. 2). The final configuration is shown in FIG. 5.

With any of the two above-mentioned methods, it is possible to meter in the relative amount of functional material in each well by controlling the depth of each well as the resistance from the compressed gas in each well is related to the percentage of the well that is filled. Thus, a deeper well will have less pressure and can therefore be filled deeper than a shallower well. Furthermore, the pressure in the wells can be reduced during the dispensing process to increase the amount of material that fills each well. Additionally, a layer of the functional material may be deposited with a dispensing system that may be metered to deposit a precise thickness. The functional material may be placed in the wells by a variety of means including a squeegee, roll coater, slot coater, pressure dispensing, etc. As the volume of the wells may be larger than the volume of the functional material that is pressed into them, there is preferably a gap, or ullage, between the bottom of the wells and the functional material.

The amount of functional material that goes into the wells may further be controlled by controlling the surface tension of the coating within the wells. For example, a first coating may be applied with a functional material that has a surface tension that is lower than the solvent base in the functional material so as to make the functional material phobic to that surface. The first coating may be applied with atomic layer deposition (ALD) as it is conformal and will coat the interior of the wells down to their full depth. A second coating may be also be applied to the second surface with a material that has a surface tension that is higher than the first coating. Preferably, the second coating has a surface tension that is additionally higher than the solvent in the functional material. The second coating may be applied with sputtering as it will not penetrate to the bottom of the well if the depth of the well is appreciably more than the diameter of the well.

The dispensing of the functional material from the wells may be controlled by controlling the collimation of the pulsed light. By using a collimated or partially collimated source of light, the bottom of the wells are preferentially heated over the top of the wells. Thus, the functional material, which is adjacent to the well only near the top is heated far less than if it occupied the bottom of the wells as well. As the absorptive material at the bottom of the well is heated, it heats the air in the well adjacent to it. This heating increases the pressure in the well to expel the functional material to a substrate. Since the heat transfer coefficient of the hot gas to the functional material is far less than that from the walls to the functional material, the functional material is expelled without being substantially heated.

If it is often desired to uniformly heat the absorptive material, a light scattering material layer may also applied to first surface of plate, a plate has an index of refraction greater than 1, and incident light impinging upon plate has a tendency to bend towards the normal angle drawn from the plane of plate. The bending of the incident radiation by plate makes the irradiation of the absorptive layer less uniform, and by applying light scattering layer on first surface of plate, such effect can be mitigated. Another light scattering material layer may also be placed on a surface of a plate before a reflective layer is deposited. Such a layer additionally increases the uniformity of the light impinging on an absorptive layer. Light scattering material layer may be made of a variety of materials such as porous materials, microlens arrays, patterned structures, and metamaterials. It may also be generated by roughening incident surface.

It is possible to utilize the present invention to print functional material onto a non-planar substrate, e.g., a three-dimensional structure. In this case, the surface having the wells may be discontinuous or curved to match the surface of the receiving substrate. Printing on a non-planar substrate can have useful applications such as printing an antenna onto a curved surface (either concave or convex) or over discontinuous surfaces.

It is also possible to utilize the present invention to perform printing functional material upside down. When the printed material has a low viscosity, it may extend after printing due to gravity to make structures with very high aspect ratios.

The following are additional types of layers that allow the method of the present invention to be even more flexible and more advantageous.

Volatizing Release Layer

One technique that can be used to facilitate ejecting the functional material is the additional of a volatilizing release layer (VRL). Specifically, the wells may be coated with a thin layer of a material that is easily volatilized before the functional material is placed in the wells. In particular, if the VRL material has a boiling point that is less than the maximum temperature the functional material can withstand, then the material is dispensed without ever reaching its maximum temperature as the gas generated from the volatilization of the VRL becomes clamped at its boiling temperature. In effect, this thin layer can act similarly to a DRL in the LIFT process. Unlike the LIFT process, the carrier substrate is reusable and the amount of functional material that is dispensed is dependent on the amount of functional material that has been placed in the wells and NOT the pulsed light fluence as it is with LIFT.

One method to deposit the volatilization layer is the cool the carrier plate to condense a thin layer of liquid onto the surface of the carrier plate before the functional material is applied to the carrier plate. Preferably, the release layer has a phase change temperature equal to or lower than any of the solvents or components in functional material 38. A possible material for the VRL is poly(propylene carbonate). (Charlie: need low BP biocompatible materials here.)

The application can be performed by a number of deposition technologies such as roll coating, vapor deposition, misting, etc.

Functional Release Layer

A thin layer of a first functional material may be applied to the wells before application of a second functional material, wherein the first functional material is different from the second functional material. This will give the final printed structure unique properties. For example, an elastomeric material may first be applied before an electrically conductive paste. After the functional materials have been printed and thermally cured, the final structure has electrical conductivity and flexibility due to the conductive paste and elastomeric material, respectively. This approach yields better conductivity and better flexibility that simply mixing in a polymer into a conductive paste.

As another example, an activator may be applied before the application of a functional material. The purpose of the activator is to cure the functional material.

Porous Release Layer

The release mechanism of functional material 38 can be improved by applying a thin micro- or nano-structural layer within wells 35$a$-35$b$, between functional material 38 and light-absorbing material layer 34. The release structure needs to be able to contain a solvent, so it has to have pores. Depending on the particle size of functional material 38, the pore size can be either in the micrometer- or nanometer- range. The pores in the release structure are filled with a volatizing release layer before application of functional material 38. Typically, a low boiling point solvent also has a low phase change temperature, meaning that functional material 38 can be printed with a lower energy light pulse. Alternatively, the solvent from functional material 38 can preferentially go into the pores when it is applied. In both cases, the gas generation within the release structure is less dependent on the properties of functional material 38. This should lead to a more homogeneous process. Also, thermal damage to functional material 36 can be further prevented, as it is not heated in a direct manner.

This may be important when printing, biological materials that are thermally fragile. Even without the volatizing release layer, this is a "cold" printing process as there is little time to transfer much heat. Functional material 38 will always heat up until it reaches the phase change temperature. However, it is typically less than 1 micron of material that is significantly heated. However, with the volatizing release layer, the peak temperature seen by functional material 38 is reduced further.

An alternative to a porous release layer structure for the purpose of helping to eject the functional material is the application of a low surface tension layer between light-absorbing material layer 34 and functional material 38 to enhance the release of functional material 38 as well as enhance the cleanability of the surface after printing and before the subsequent application of more functional material 38. The low surface tension layer may also be selectively applied within a well so as to encourage deposition of functional material 38 onto desired portions of wells 35$a$-35$b$.

Light-absorbing material layer 34 may be selectively coated with the low surface tension layer to functional material 38 to aid in releasing functional material 38 from wells 35$a$-35$b$.

As has been described, the present invention provides a method for depositing a functional material on a substrate.

While the invention has been particularly shown and described with reference to a preferred embodiment, it will be understood by those skilled in the art that various changes in form and detail may be made therein without departing from the spirit and scope of the invention.

What is claimed is:

1. A method for depositing a functional material on a substrate, said method comprising:
   providing a plate having a first surface and a second surface;
   removing materials from said second surface to form a plurality of wells within said second surface;
   coating walls of one of said plurality of wells with a light-absorbing material;
   filling an opening of said one well with a functional material while leaving an ullage between said functional material and the bottom of said one well; and
   irradiating said plate with pulsed light to heat said light-absorbing material in order to release said functional material from said one well onto a receiving substrate.

2. The method of claim 1, wherein said irradiating further includes irradiating said plate with a non-collimated light source.

3. The method of claim 1, wherein said removing includes laser drilling.

4. The method of claim 1, wherein said removing includes etching.

5. The method of claim 1, wherein said second surface is substantially flat.

6. The method of claim 1, wherein said second surface is curved.

7. The method of claim 1, wherein said receiving substrate is curved.

8. The method of claim 1, wherein said functional material is an elastomeric material.

9. A method for depositing a functional material on a substrate, said method comprising:
   providing a plate having a first surface and a second surface;
   removing materials from said second surface to form a plurality of wells having a first depth within said second surface;
   coating walls of one of said plurality of wells with a reflective material;
   removing additional materials from a bottom of said one well to form a deeper well having a second depth;
   coating said reflective material and walls of said deeper well with a light-absorbing material;
   filling an opening of said one well with a functional material while leaving an ullage between said functional material and the bottom of said deeper well; and
   irradiating said plate with pulsed light to heat said light-absorbing material in order to release said functional material from said one well onto a receiving substrate.

10. The method of claim 9, wherein said irradiating further includes irradiating said plate with a non-collimated light source.

11. The method of claim 9, wherein said removing includes laser drilling.

12. The method of claim 9, wherein said removing includes etching.

13. The method of claim 9, wherein said second surface is substantially flat.

14. The method of claim 9, wherein said second surface is curved.

15. The method of claim 9, wherein said receiving substrate is curved.

16. A method for depositing a functional material on a substrate, said method comprising:
   providing a first plate having a first surface and a second surface;
   depositing a reflective material on said second surface of said first plate;
   placing a second plate on said second surface of said first plate;
   removing materials from said first and second plates to form a plurality of wells within said first and second plates;
   coating walls of one of said wells with a light-absorbing material;
   filling an opening of said one well with a functional material while leaving an ullage between said functional material and the bottom of said one well; and
   irradiating said first and second plates with a pulsed light to heat said light-absorbing material in order to release said functional material from said one well onto a receiving substrate.

17. The method of claim 16, wherein said irradiating further includes irradiating said plate with a non-collimated light source.

18. The method of claim 16, wherein said removing includes laser drilling.

19. The method of claim 16, wherein said removing includes etching.

20. The method of claim 16, wherein said second surface is substantially flat.

21. The method of claim 16, wherein said second surface is curved.

22. The method of claim 16, wherein said receiving substrate is curved.

* * * * *